(12) United States Patent
Choi et al.

(10) Patent No.: US 10,964,560 B2
(45) Date of Patent: Mar. 30, 2021

(54) SUBSTRATE CHUCK AND SUBSTRATE BONDING SYSTEM INCLUDING THE SAME

(71) Applicant: Samsung Electronics Co., Ltd., Suwon-si (KR)

(72) Inventors: Youngbin Choi, Suwon-si (KR); Heebok Kang, Hwaseong-si (KR)

(73) Assignee: Samsung Electronics Co., Ltd.

(*) Notice: Subject to any disclaimer, the term of this patent is extended or adjusted under 35 U.S.C. 154(b) by 519 days.

(21) Appl. No.: 15/203,486

(22) Filed: Jul. 6, 2016

(65) Prior Publication Data

US 2017/0178931 A1  Jun. 22, 2017

(30) Foreign Application Priority Data

Dec. 22, 2015 (KR) ......................... 10-2015-0183959

(51) Int. Cl.
  *H01L 21/67* (2006.01)
  *H01L 21/687* (2006.01)
  *H01L 21/683* (2006.01)

(52) U.S. Cl.
  CPC .... *H01L 21/67092* (2013.01); *H01L 21/6838* (2013.01); *H01L 21/6875* (2013.01); *H01L 21/68735* (2013.01); *H01L 21/68742* (2013.01); *H01L 21/68785* (2013.01)

(58) Field of Classification Search
  CPC .......... H01L 21/67092; H01L 21/6838; H01L 21/68735; H01L 21/68742; H01L 21/6875; H01L 21/68785
  USPC .......... 425/450.1; 269/48.2, 54.1, 54.3, 54.5
  See application file for complete search history.

(56) References Cited

U.S. PATENT DOCUMENTS

| 4,724,222 | A | * | 2/1988 | Feldman | G03F 7/707 250/492.2 |
|---|---|---|---|---|---|
| 6,805,338 | B1 | | 10/2004 | Okuda | |
| 7,659,964 | B2 | * | 2/2010 | Lin | H01L 21/67259 355/53 |
| 8,652,260 | B2 | | 2/2014 | Yu et al. | |
| 9,490,158 | B2 | * | 11/2016 | Huang | H01L 21/67092 |
| 2002/0036881 | A1 | * | 3/2002 | Shamouilian | C04B 35/185 361/234 |
| 2007/0287264 | A1 | * | 12/2007 | Rogers | H01L 21/187 438/457 |
| 2014/0265165 | A1 | * | 9/2014 | Lin | H01L 21/67092 279/142 |
| 2015/0047784 | A1 | | 2/2015 | Burggraf | |
| 2015/0129137 | A1 | * | 5/2015 | Sugihara | H01L 21/67092 156/556 |

OTHER PUBLICATIONS

Yu et al., "Mathematical Model of Low-Temperature Wafer Bonding Under Medium Vacuum and its Application," IEEE Transactions on Advanced Packaging, vol. 28, No. 4, Nov. 2005, pp. 650-658.

\* cited by examiner

*Primary Examiner* — Philip C Tucker
*Assistant Examiner* — Andrew L Swanson
(74) *Attorney, Agent, or Firm* — Myers Bigel, P.A.

(57) ABSTRACT

Provided are a substrate chuck and a substrate bonding system including the substrate chuck. The substrate bonding system includes a lower substrate chuck and an upper substrate chuck disposed on the lower substrate chuck. The lower substrate chuck has a non-flat lower substrate contact surface, and the upper substrate chuck has a flat upper substrate contact surface.

9 Claims, 8 Drawing Sheets

SUBSTRATE CHUCK AND SUBSTRATE BONDING SYSTEM INCLUDING THE SAME

CROSS-REFERENCE TO RELATED APPLICATION

This application claims priority under 35 U.S.C. § 119 to Korean Patent Application No. 10-2015-0183959 filed on Dec. 22, 2015, the disclosure of which is hereby incorporated by reference in its entirety.

FIELD

Embodiments of the inventive concept relate to a substrate chuck used in a process of bonding two substrates, and a substrate bonding system including the substrate chuck.

BACKGROUND

In order to form semiconductor components and/or CMOS image sensor (CIS) products, a wafer bonding process for bonding two semiconductor wafers may be used. During the process for bonding the semiconductor wafers, various types of process defects may be generated. For example, void defects in which a void is formed between two bonded semiconductor wafers, overlay defects formed between two wafers, or the like may be generated.

SUMMARY

Embodiments of the inventive concept provide a substrate chuck used in a substrate bonding process.

Other embodiments of the inventive concept provide a substrate bonding system including a substrate chuck used in a substrate bonding process.

Other embodiments of the inventive concept provide a substrate chuck in which defects can be prevented from being generated in a substrate bonding process, and a substrate bonding system including the substrate chuck.

The technical objectives of the inventive concept are not limited to the above disclosure; other objectives may become apparent to those of ordinary skill in the art based on the following descriptions.

In accordance with an aspect of the inventive concept, a substrate chuck includes a base, a plurality of support pins disposed on the base, and a dam portion which is disposed on the base and surrounds the plurality of support pins. The plurality of support pins include first support pins disposed on a first region of the base and second support pins disposed on a second region of the base. The first support pins have upper surfaces located in the same plane, and the dam portion has an upper surface located at a lower level than the upper surfaces of the first support pins.

In an embodiment, the second region may surround the first region and the dam portion may surround the second region.

In an embodiment, a width of the first region may be greater than a distance between the dam portion and the first region.

In an embodiment, the second support pins may be located at a lower level than the first support pins and a higher level than the dam portion.

In an embodiment, each of the second support pins may have a height decreasing for pins closer to the dam portion.

In an embodiment, upper surfaces of each of the second support pins may have a descending gradient closer to the dam portion.

In an embodiment, the substrate chuck may further include lift holes vertically passing through the base, and lift guard rings which are disposed on the first region of the base, and expose the lift holes and surround the lift holes. The lift guard rings may have upper surfaces disposed in the same plane as the upper surfaces of the first support pins.

In an embodiment, the substrate chuck may further include a vacuum channel disposed in the base.

In an embodiment, heights of the first support pins may be greater than distances between the plurality of adjacent support pins.

In an embodiment, the plurality of support pins may include a third support pin which overlaps a border between the first region and the second region. An upper surface of the third support pin may include a flat portion and an inclined portion.

In accordance with an aspect of the inventive concept, a substrate bonding system includes a lower substrate chuck and an upper substrate chuck disposed on the lower substrate chuck. The lower substrate chuck has a non-flat lower substrate contact surface, and the upper substrate chuck has a flat upper substrate contact surface.

In an embodiment, the lower substrate chuck may include a lower base, a plurality of support pins which protrude from an upper surface of the lower base, and a dam portion which protrudes from the upper surface of the lower base and surrounds the plurality of support pins. The lower substrate contact surface of the lower substrate chuck may include upper surfaces of the plurality of support pins and an upper surface of the dam portion, and the upper surfaces of the plurality of support pins may be located at a higher level than the upper surface of the dam portion.

In an embodiment, the plurality of support pins may include first support pins disposed on the first region of the lower base and second support pins disposed on the second region of the lower base and having lower heights than the first support pins. The first support pins may have upper surfaces located in the same plane, and the second support pins may have inclined upper surfaces.

In an embodiment, the substrate bonding system may further include a lower vacuum channel disposed in the lower base, lower lift holes passing through the lower base, and lower lift guard rings which are disposed on the lower base and expose the lower lift holes. The lift guard rings may be disposed between the first support pins and disposed with the same height as the first support pins.

In an embodiment, the upper substrate chuck may include an upper base, an upper through hole passing through a center portion of the upper base, an upper vacuum channel disposed at an edge portion of the upper base, and upper lift holes passing through the upper base disposed between the upper through hole and the upper vacuum channel, and the lower substrate chuck may include a lower base, a plurality of support pins disposed on the lower base, a dam portion which is disposed on the lower base and surrounds the plurality of support pins, lower lift holes passing through the lower base and disposed between the plurality of support pins, and lower guard rings which are disposed on the lower base and expose the lower lift holes.

In accordance with an aspect of the inventive concept, a substrate chuck includes a base, a plurality of support pins disposed on the base, a dam portion which is disposed on the base and surrounds the plurality of support pins, a vacuum channel disposed in the base, lift holes vertically passing through the base, and lift guard rings which are disposed on the base and expose the lift holes. The plurality of support pins include first support pins disposed on the first region of the base and second support pins disposed on the second region of the base. The first support pins have upper surfaces disposed in the same plane. The first support pins have the upper surfaces located at a level higher than the dam portion.

In an embodiment, the second region of the base may surround the first region of the base.

In an embodiment, the second support pins may have inclined upper surfaces.

In an embodiment, the vacuum channel may pass through the base. An upper vacuum hole of the vacuum channel may be disposed between the first support pin, and a lower vacuum hole of the vacuum channel may not overlap the upper vacuum hole and may be located closer to an outer edge of the base than the upper vacuum hole.

In an embodiment, the base may be formed of a SiC material.

Details of other embodiments are included in detailed descriptions and the drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
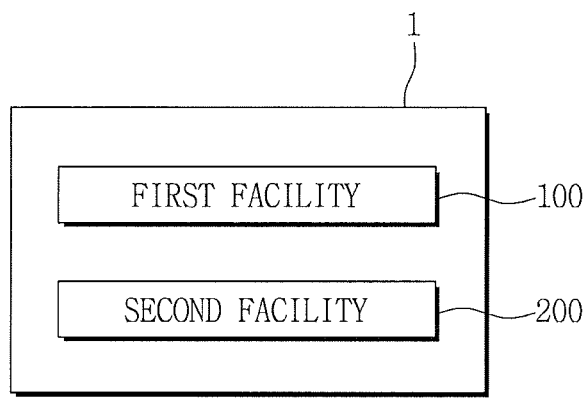
FIG. 1 is a conceptual diagram illustrating a substrate bonding system according to an embodiment of the inventive concept.

Advantages and features of the inventive concept and methods of accomplishing them will be made apparent with reference to the accompanying drawings and some embodiments to be described below. The inventive concept may, however, be embodied in various different forms and should be construed as limited only by the accompanying claims, not by the embodiments set forth herein. Rather, these embodiments are provided so that this disclosure is thorough and complete and fully conveys the inventive concept to those skilled in the art.

The terminology used herein is for the purpose of describing particular embodiments only and is not intended to be limiting of the present inventive concept. As used herein, the singular forms "a," "an," and "the" are intended to include the plural forms as well unless the context clearly indicates otherwise. It will be further understood that the terms "comprises," "comprising," "includes," and/or "including," when used in this specification, specify the presence of stated features, integers, steps, operations, elements, and/or components but do not preclude the presence or addition of one or more other features, integers, steps, operations, elements, components, and/or groups thereof.

Like reference numerals throughout this specification denote like elements. As used herein, the term "and/or" includes any and all combinations of one or more of the associated listed items.

Spatially relative terms, such as "beneath," "below," "lower," "above," "upper," and the like, may be used herein for ease of description in describing one element's or feature's relationship to another/other element(s) or feature (s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both orientations above and below. The device may be otherwise oriented (rotated 90 degrees or at other orientations) and the spatially relative descriptors used herein may be interpreted accordingly.

The exemplary embodiments of the invention will be described with reference to cross-sectional views and/or plan views which are ideal exemplary views. Thicknesses of layers and areas are exaggerated for effective description of the technical contents in the drawings. Forms of the embodiments may be modified by the manufacturing technology and/or tolerance. Therefore, the embodiments of the invention are not intended to be limited to illustrated specific forms and include modifications of forms generated according to manufacturing processes. For example, an illustrated etching area at a right angle corner may be rounded or have a predetermined curvature. Therefore, areas illustrated in the drawings have schematic properties, and shapes of the areas are illustrated special forms of the areas of a device and are not intended to limit the scope of the invention.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

FIG. 1 is a conceptual diagram illustrating a substrate bonding system according to an embodiment of the inventive concept.

Referring to FIG. 1, a substrate bonding system 1 according to an embodiment of the inventive concept may include a first facility 100 and a second facility 200.

The first facility 100 may be a bonding facility capable of bonding two substrates, and the second facility 200 may be a heat treatment facility capable of increasing the bonding strength between two bonded substrates. For example, the first facility 100 may be a facility in which two substrates are in contact with each other to be bonded, and the second facility 200 may be a heat treatment facility in which the bonding strength between the two bonded substrates in contact with each other may be increased by performing a heat treatment process (an annealing process).

Figure 2:
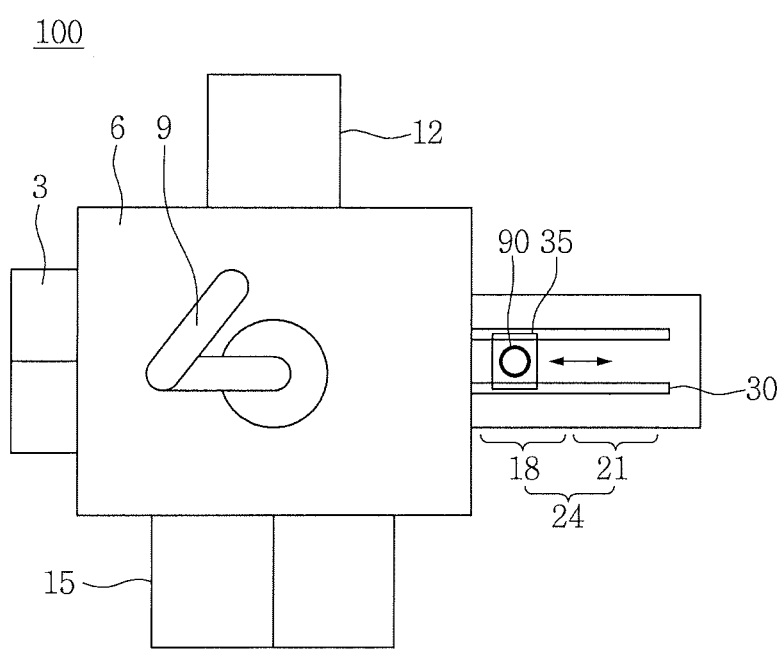
FIG. 2 is a view schematically illustrating a first facility of a substrate bonding system according to an embodiment of the inventive concept.

FIG. 2 is a view schematically illustrating the first facility 100.

Referring to FIGS. 1 and 2, the first facility 100 may include a loading port 3 capable of loading and unloading a first substrate and a second substrate which are bonding targets, a transfer space 6 in which the first and second substrates are moved using a transferring device 9 in the first facility 100, a plasma chamber 12 in which a plasma treatment is performed on the second substrate, a cleaning unit 15 capable of cleaning the first and second substrates, and a bonding unit 24 capable of bonding the first and second substrates.

The bonding unit 24 may include a first portion 18 and a second portion 21. The first portion 18 may be closer to the transfer device 9 than the second portion 21. The first portion 18 may be a portion on which the first and second substrates transferred by the transferring device 9 are mounted. The second portion 21 may be a portion in which a bonding process is performed on the first and second substrates.

The bonding unit 24 may include a first substrate chuck 90 in which the second substrate is mounted, a plate 35 on which the first substrate chuck 90 is placed, and a rail system 30 capable of reciprocating movement for the plate 35 between the first portion 18 and the second portion 21. Further, the bonding unit 24 may include a second substrate chuck disposed on the first substrate chuck 90 and capable of facing the first substrate chuck 90.

Figure 3:
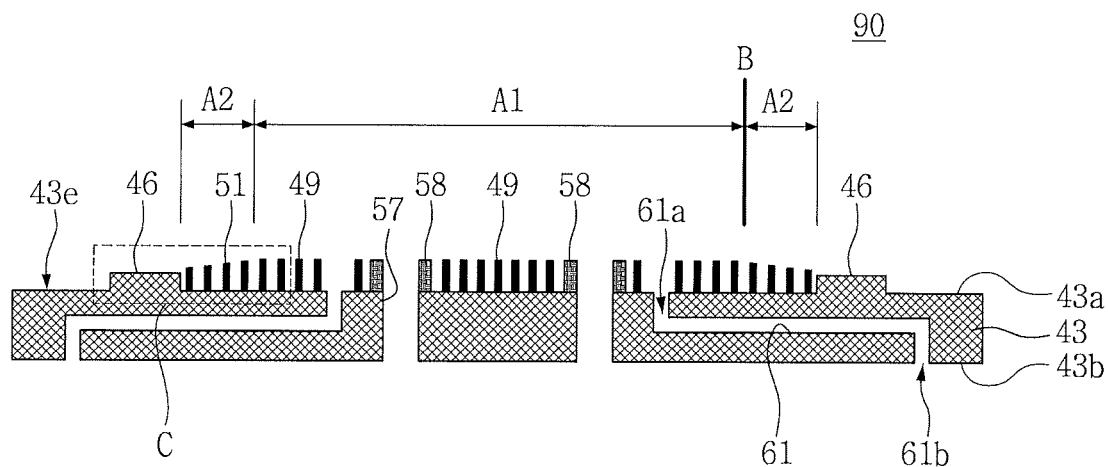
FIG. 3 is a cross-sectional view illustrating an example of a first substrate chuck of a first facility of a substrate bonding system according to an embodiment of the inventive concept.
Figure 5:
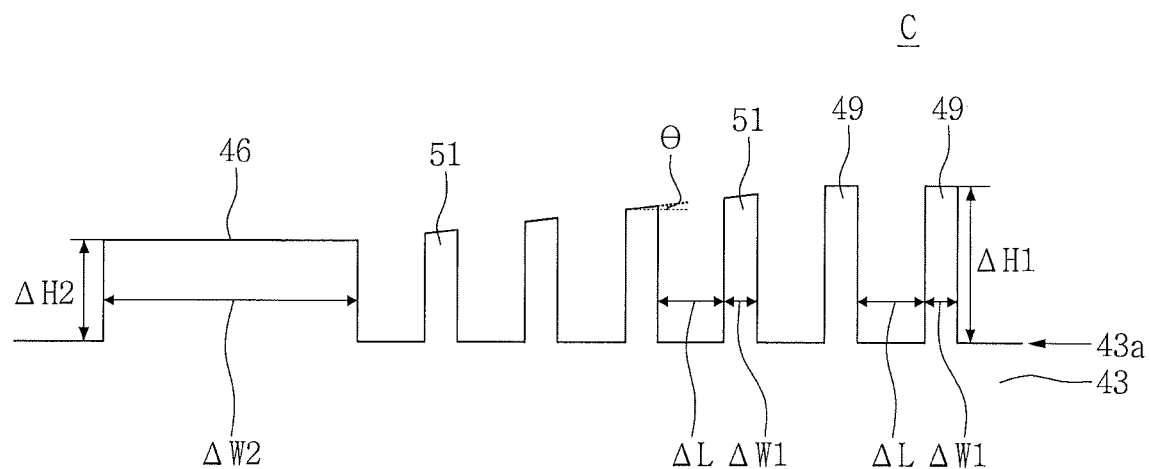
FIGS. 5, 6A, and 6B are cross-sectional views illustrating a portion of a first substrate chuck of a first facility of a substrate bonding system according to an embodiment of the inventive concept.
Figure 6A:
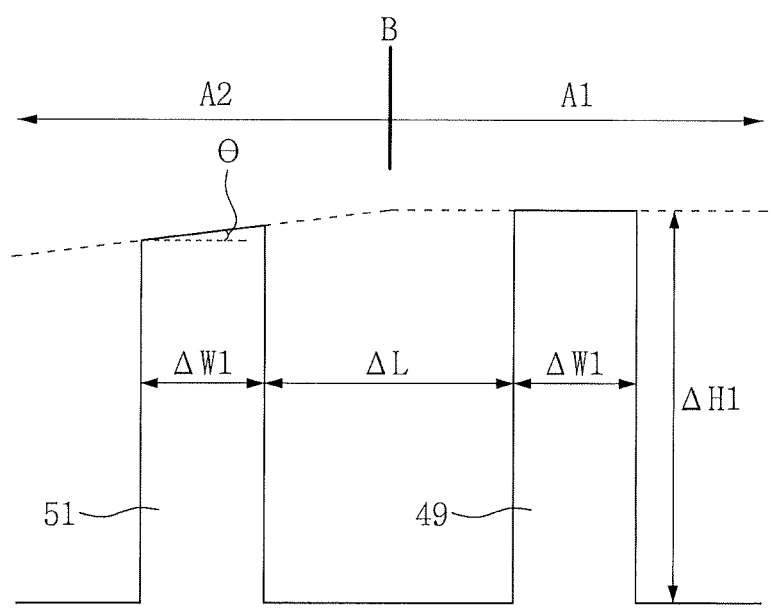
Figure 6B:
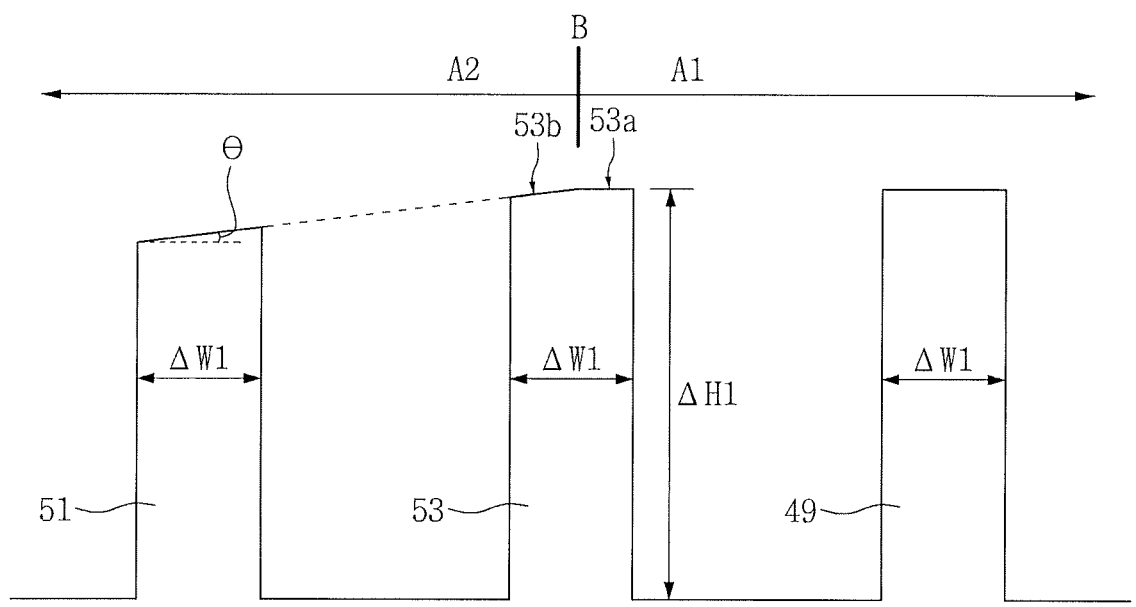

An example of the first substrate chuck 90 will be described with reference to FIGS. 3, 4, 5, 6A, and 6B. FIG. 3 is a cross-sectional view illustrating the example of the first substrate chuck 90, FIG. 4 is a top view illustrating the example of the first substrate chuck 90, FIG. 5 is a cross-sectional view illustrating a portion of the example of the first substrate chuck 90 (i.e., C of FIG. 3), and FIGS. 6A and 6B are cross-sectional views each illustrating the portion of the example of the first substrate chuck 90.

Figure 4:
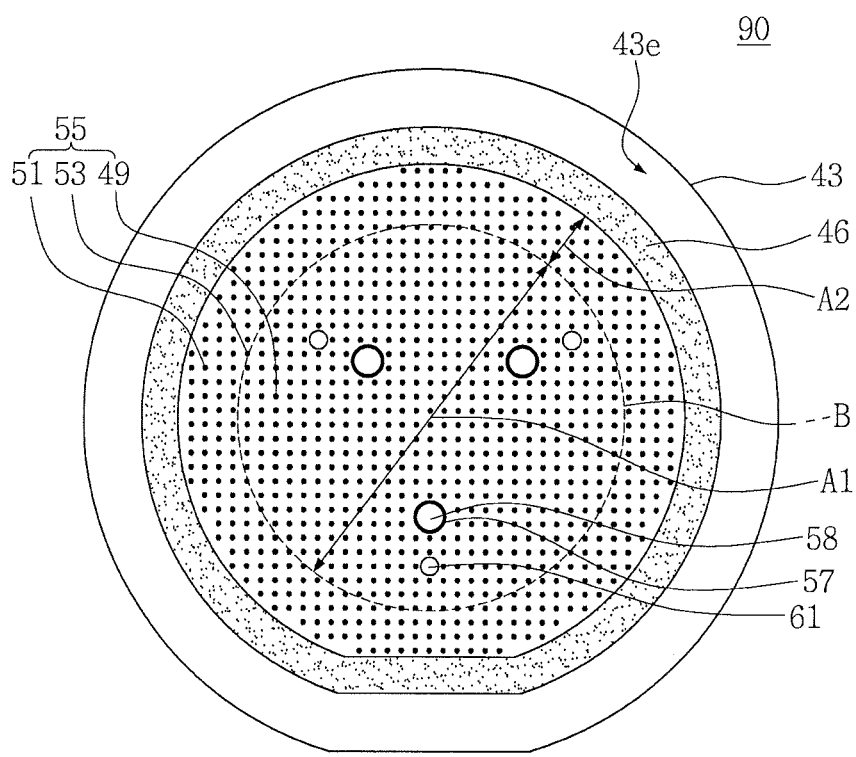
FIG. 4 is a top view illustrating an example of a first substrate chuck of a first facility of a substrate bonding system according to an embodiment of the inventive concept.

First, referring to FIGS. 3 and 4, the first substrate chuck 90 may include a first base 43, a dam portion 46, a plurality of support pins 55, lower lift holes 57, lower lift guard rings 58, and lower vacuum channels 61. The first substrate chuck 90 may be referred to as a lower substrate chuck, and the first base 43 may be referred to as a lower base.

The first base 43 may have a first region A1 and a second region A2. The first base 43 may be formed of a SiC material. The dam portion 46 may be disposed on an upper surface 43a of the first base 43 to circumferentially surround (i.e., extending circumferentially around) the first and second regions A1 and A2, as illustrated. The first region A1 may be located at a center portion of the first base 43 and may have a circular shape. The second region A2 may have a donut shape which surrounds the first region A1. A width or diameter of the first region A1 may be greater than a width of the second region A2. Here, the width of the second region A2 may be a distance between the first region A1 and the dam portion 46. Therefore, the width or diameter of the first region A1 may be greater than the distance between the first region A1 and the dam portion 46.

The dam portion 46 may protrude from the upper surface 43a of the first base 43. The dam portion 46 may have a flat upper surface. In a top view, the dam portion 46 may have a ring shape. The dam portion 46 may be spaced apart from an outer corner of the first base 43. In the first base 43, an edge region 43e between the outer corner and the dam portion 46 may be flat and located at a level lower than the upper surface of the dam portion 46.

The lower lift holes 57 may pass through the first base 43. The lower lift holes 57 may pass through the first base 43 in the first region A1.

The lower lift guard rings 58 may be disposed on (i.e., extend outwardly from) the upper surface 43a of the first base 43. The lower lift guard rings 58 may respectively correspond to the lower lift holes 57 and expose the lower lift holes 57. For example, the lower lift guard rings 58 may be formed to have a hollow pipe shape, and empty portions of the lower lift guard rings 58 may overlap the lower lift holes 57 and expose the lower lift holes 57.

The lower vacuum channels 61 may pass through the first base 43. One end of the lower vacuum channel 61 located on the upper surface 43a of the first base 43, that is, for example, an upper vacuum hole 61a, may be disposed in the first region A1 of the first base 43. The other end of the lower vacuum channel 61 located on a lower surface 43b of the first base 43, that is, for example, a lower vacuum hole 61b, may not overlap the upper vacuum hole 61a. The lower vacuum hole 61b may be located at an outer side relative to the upper vacuum hole 61a. In other words, the upper vacuum hole 61a may be located on the upper surface 43a of the first base 43 in the first region A1, and the lower vacuum hole 61b may be located on the lower surface 43b of the first base 43 in the edge region 43e.

The plurality of support pins 55 may include first support pins 49, second support pins 51, and third support pins 53.

The first support pins 49 may be disposed on (i.e., extend outwardly from) the first region A1 of the first base 43. The first support pins 49 may protrude from the upper surface 43a of the first base 43 and may be disposed at the same height (i.e., may each have the same height). The first support pins 49 may have the same height as the lower lift guard rings 58. The lower lift guard rings 58 may be disposed between the first support pins 49.

The second support pins 51 may be disposed on (i.e., extend outwardly from) the second region A2 of the first base 43. The second support pins 51 may protrude from the upper surface 43a of the first base 43 and may be formed with a height lower than the first support pins 49 and the lower lift guard rings 58 (i.e., a height of the second support pins 51 may be lower than a height of the first support pins 49 and the lower lift guard rings 58).

The first support pins 49 and the second support pins 51 will be described with reference to FIGS. 3, 4, and 5.

Referring to FIGS. 3, 4, and 5, the first support pins 49 may have flat upper surfaces disposed in the same plane and may protrude from the upper surface 43a of the first base 43 by a first height $\Delta H1$.

The dam portion 46 may be formed to have a second height $\Delta H2$ lower than the first height $\Delta H1$. The upper surface of the dam portion 46 may be formed at a level lower than upper surfaces of the first support pins 49. A width of the dam portion 46 may be greater than a width of an upper surface of each of the plurality of support pins 55. Here, the dam portion 46 may be formed to have a ring shape of a predetermined width, and the width of the ring shape may be defined as the width of the dam portion 46.

Each of the second support pins 51 may be formed to have a height between the first height $\Delta H1$ and the second height $\Delta H2$. Regarding the second support pins 51, the heights of pins near the dam portion 46 may be smaller than the heights of pins near the first support pins 49. The heights of the second support pins 51 may decrease toward the dam portion 46 as illustrated in FIG. 5 (i.e., in a radially outward direction). The heights of the second support pins 51 may gradually decrease toward the dam portion 46. Upper surfaces of the second support pins 51 may be inclined at a predetermined angle θ. The angle θ may be greater than 0 degree and smaller than 90 degrees. Each of the second support pins 51 may have an inclined upper surface and a portion thereof facing the dam portion 46 may be low. In other words, the upper surface of each second support pin 51 may taper downwardly toward the dam portion 46 (i.e., in a radially outward direction).

Adjacent pins among the plurality of support pins 55 may be spaced apart from each other by a first distance ΔL. The plurality of support pins 55 may have the same width ΔW1. The dam portion 46 may have a second width ΔW2 greater than a first width ΔW1.

In an embodiment, the second width ΔW2 of the dam portion 46 may be greater than the first distance ΔL.

The plurality of support pins 55 and a border B between the first and second regions A1 and A2 will be described with reference to FIGS. 6A and 6B.

FIGS. 6A and 6B illustrate the border B between the first and second regions A1 and A2. The border B between the first and second regions A1 and A2 may have a portion which passes between the first support pins 49 and the second support pins 51 and/or a portion which overlaps some pins of the plurality of support pins 55.

In an embodiment, as illustrated in FIG. 6A, the border B between the first and second regions A1 and A2 may pass between the first support pins 49 and the second support pins 51.

In an embodiment, as illustrated in FIG. 6B, a portion of the border B between the first and second regions A1 and A2 may overlap some pins of the plurality of support pins 55. In this manner, the pins among the plurality of support pins 55 which overlap the border B between the first and second regions A1 and A2 may be referred to as the third support pins 53.

Each of the third support pins 53 may have a flat first upper surface 53a and an inclined second upper surface 53b.

The first upper surfaces 53a of the third support pins 53 may be disposed with the same height as the upper surfaces of the first support pins 49. The second upper surfaces 53b of the third support pins 53 may be inclined at the same angle θ as the upper surfaces of the second support pins 51. The second upper surfaces 53b of the third support pins 53 may be inclined in the same manner as the upper surfaces of the second support pins 51 so as to become lower going toward the dam portion 46. In other words, the second upper surfaces 53b taper downwardly toward the dam portion 46.

Figure 7:
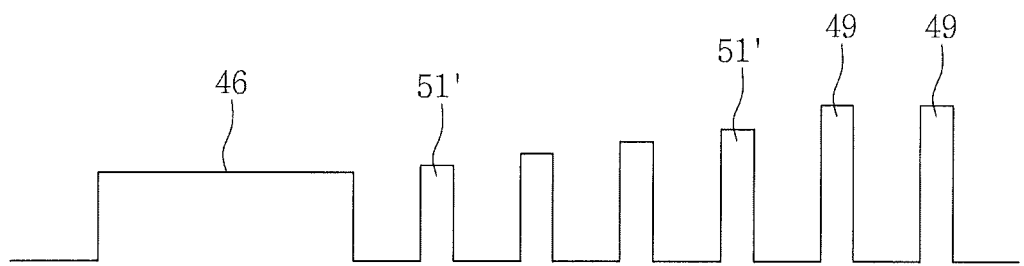
FIG. 7 is a cross-sectional view illustrating another example of a first substrate chuck of a first facility of a substrate bonding system according to an embodiment of the inventive concept.

In an embodiment, the second support pins 51 may have inclined upper surfaces. However, the inventive concept is not limited thereto. For example, as illustrated in FIG. 7, the second support pins 51' may have flat upper surfaces of different heights. The second support pins 51' having the flat upper surfaces may have lower heights than the first support pins 49 and the heights thereof may be gradually decreased toward the dam portion 46.

A second substrate chuck 190 facing the first substrate chuck 90 will be described with reference to FIG. 8.

Figure 8:
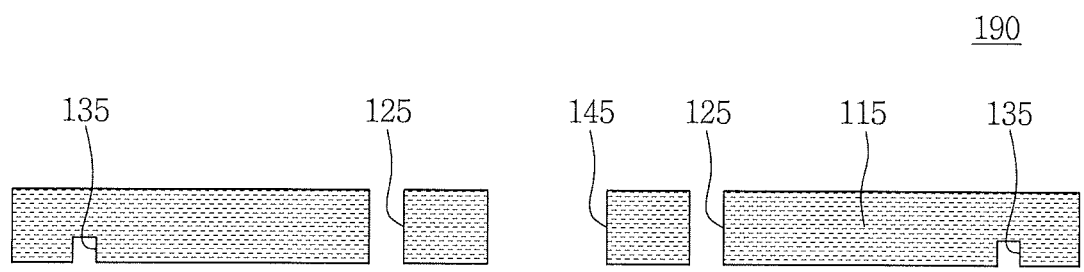
FIG. 8 is a cross-sectional view illustrating an example of a second substrate chuck of a first facility of a substrate bonding system according to an embodiment of the inventive concept.

Referring to FIG. 8, the second substrate chuck 190 may include an upper base 115, upper through holes 145, upper lift holes 125, and upper vacuum channels 135.

The upper through holes 145 may pass through a center portion of the second substrate chuck 190. The upper vacuum channels 135 may be disposed at edge portions of the second substrate chuck 190. The upper lift holes 125 may pass through the upper base 115 between the upper through holes 145 and the upper vacuum channel 135.

Figure 10:
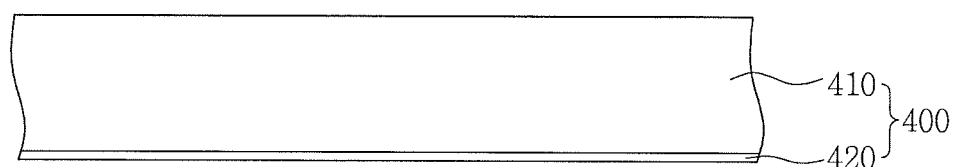
Figure 10:
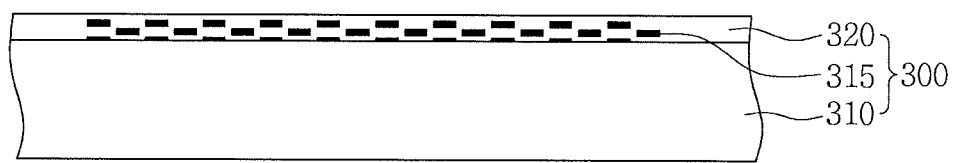
Figure 11:
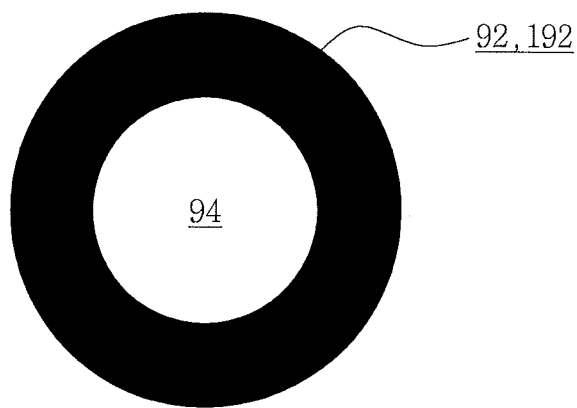
Figure 12:
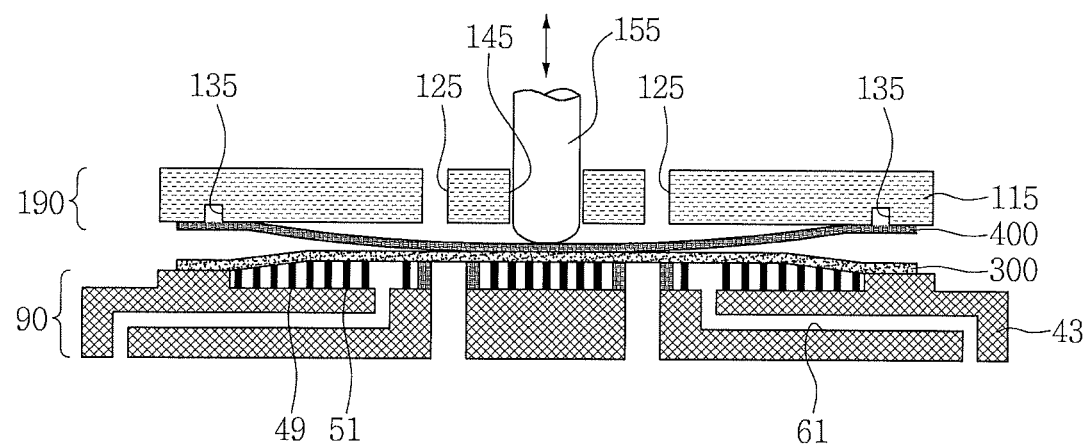
Figure 13:
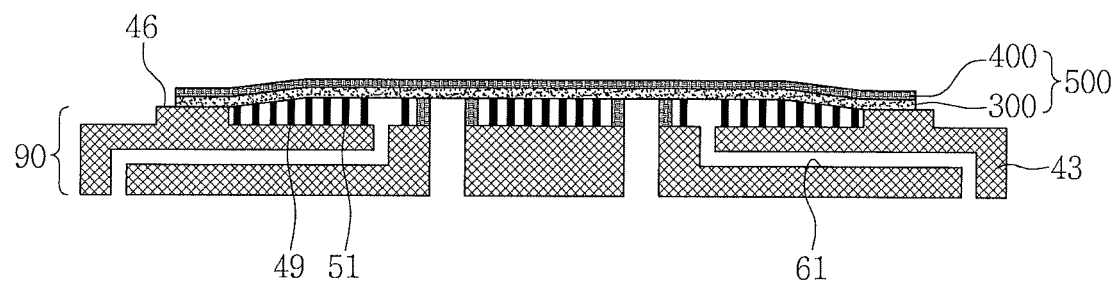
Figure 14:
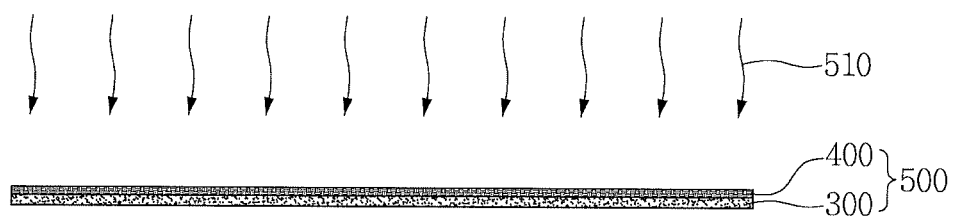

Hereinafter, a substrate bonding system 1 according to an embodiment of the inventive concept and a substrate bonding process performed using the substrate bonding system 1 will be described with reference to FIGS. 9 to 14. In FIGS. 9 to 14, FIG. 9 is a view illustrating a configuration in which a first substrate 300 is mounted on a first substrate chuck 90 and a second substrate 400 is mounted on a second substrate chuck 190, FIG. 10 is a view for describing the first and second substrates 300 and 400, FIG. 11 is a cross-sectional view illustrating lift pins 92 and 192 of the substrate bonding system 1, FIG. 12 is a view illustrating a shape in which the first and second substrates 300 and 400 are starting to be bonded, FIG. 13 is a view illustrating a configuration in which the first and second substrates 300 and 400 are bonded on the first substrate chuck 90, and FIG. 14 is a view illustrating a heat treatment process performed in the second facility 200.

Figure 9:
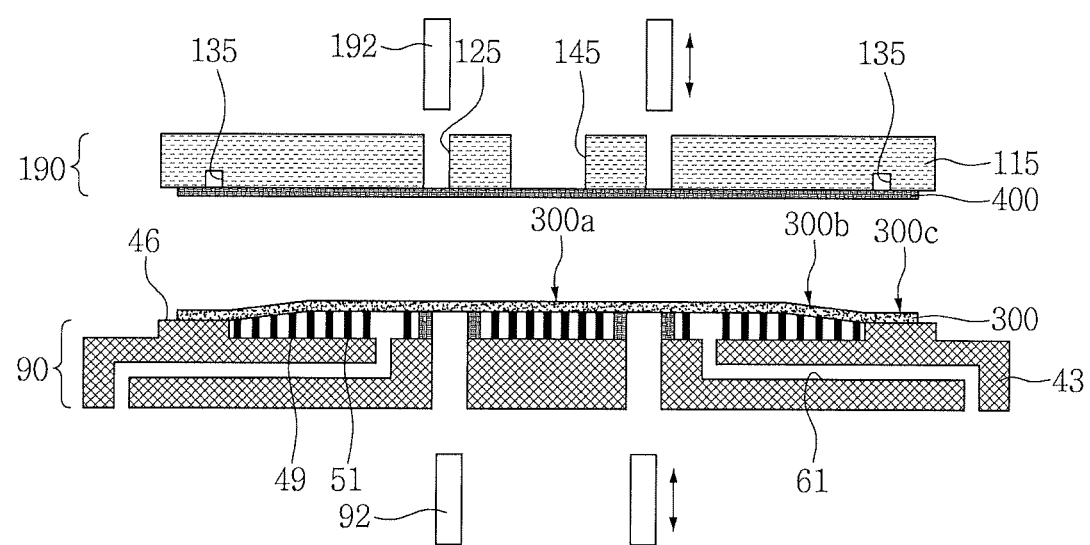
FIGS. 9 to 14 are views for describing a substrate bonding system according to an embodiment of the inventive concept, and a substrate bonding process performed using the substrate bonding system.

First, referring to FIGS. 1, 2, and 9, the substrate bonding system 1 may include the first substrate chuck 90 and the second substrate chuck 190 facing each other. The first substrate chuck 90 may be referred to as a lower substrate chuck, and the second substrate chuck 190 disposed on the first substrate chuck 90 may be referred to as an upper substrate chuck.

The first substrate chuck 90 may be the same as that described with reference to FIGS. 3 to 6B. The second substrate chuck 190 may be the same as that described with reference to FIG. 8.

The first substrate 300 may be located on the first substrate chuck 90. The second substrate 400 may be located under the second substrate chuck 190. Hereinafter, the first substrate 300 is to be referred to as a lower substrate, and the second substrate 400 is to be referred to as an upper substrate.

An example of the lower substrate 300 and upper substrate 400 will be described with reference to FIG. 10.

Referring to FIG. 10, the lower substrate 300 may include a lower semiconductor wafer 310 and a lower insulating structure 320 which is disposed on the lower semiconductor wafer 310 and covers internal circuits and/or internal interconnections 315.

The upper substrate 400 may include an upper semiconductor wafer 410 and an upper insulating layer 420 disposed on the upper semiconductor wafer 410. The upper semiconductor wafer 410 may be a bare semiconductor wafer, and the upper insulating layer 420 may be formed in the plasma chamber 12 of the first facility 100.

Referring again to FIGS. 1, 2, 3 and 9, locating the lower substrate 300 on the first substrate chuck 90 may include moving the lower substrate 300 to a cleaning unit 15 from the loading port 3 using the transferring device 9, cleaning the lower substrate 300, and moving the cleaned lower substrate 300 onto the first substrate chuck 90 located on a first portion 18 of a bonding unit 24.

The first portion 18 of the bonding unit 24 of the first facility 100 may include lower lift pins 92 and upper lift pins 192. The lower lift pins 92 and the upper lift pins 192 may make vertically reciprocating movements. Each of the lower lift pins 92 and the upper lift pins 192 may have a suction channel therein. For example, as illustrated in FIG. 11, each of the lower lift pins 92 and the upper lift pins 192 may have a suction channel 94 using a vacuum.

The lower lift pins 92 disposed under the first substrate chuck 90 may be lifted to pass through the lower lift holes 57 of the first substrate chuck 90 and to be moved higher than the first support pins 49 of the first substrate chuck 90. The lower lift pins 92 may be in contact with the lower substrate 300 to fix or adsorb the lower substrate 300 using the suction channels 94 of the lower lift pins 92.

Next, the lower lift pins 92 are moved downward, and thus the lower substrate 300 may be in contact with the first support pins 49 of the first substrate chuck 90. Then, the lower substrate 300 is bent and may come in contact with the second and third support pins 51 and 53 and the dam portion 46 of the first substrate chuck 90. In this case, the lower substrate 300 may be fixed to the first substrate chuck 90 due to the suction force by the lower vacuum channels 61 of the first substrate chuck 90.

Therefore, the lower substrate 300 may be in contact with the upper surfaces of the plurality of support pins 55 and the upper surface of the dam portion 46 on the first substrate chuck 90, and a portion thereof may become bent.

In the lower substrate 300, a first portion 300a which overlaps the first region A1 of the first substrate chuck 90 may be flat, a second portion 300b which overlaps the second region A2 of the first substrate chuck 90 may be inclined to have a gradient decreased toward an outer side, and a third portion 300c which overlaps the dam portion 46 may be flat and located at a lower level than the first portion 300a.

In the first substrate chuck 90, the portion in contact with the lower substrate 300 may be referred to as a lower substrate contact surface. Therefore, in the first substrate chuck 90, the upper surfaces of the plurality of support pins 55 and the upper surface of the dam portion 46 may be the lower substrate contact surfaces.

In the plasma chamber 12, the upper substrate 400 on which the upper insulating layer 420 is formed may be cleaned in the cleaning unit 15. The cleaned upper substrate 400 may be transferred to the bonding unit 24. The upper lift pins 192 disposed on the second substrate chuck 190 are lowered, pass through the upper lift holes 125 of the second substrate chuck 190, are moved under the second substrate chuck 190, and may fix or adsorb the upper substrate 400 transferred to the bonding unit 24 using the suction channels 94 of the upper lift pins 192.

Next, the upper lift pins 192 are lifted, and the upper substrate 400 may come in contact with a lower surface of the second substrate chuck 190. The upper substrate 400 may be adsorbed and/or fixed to the second substrate chuck 190 due to the suction force by the upper vacuum channels 135 of the second substrate chuck 190. The upper substrate 400 mounted under the second substrate chuck 190 may be flat.

The lower surface of the second substrate chuck 190 in contact with the upper substrate 400, that is, the upper substrate contact surface may be flat. The lower substrate contact surface of the first substrate chuck 90 in contact with the lower substrate 300 may be the upper surfaces of the plurality of support pins 55 and the upper surface of the dam portion 46, and the lower substrate contact surface may not be flat.

Each of the first and second substrate chucks 90 and 190 located on the first portion 18 in the bonding unit 24 may be moved to the second portion 21.

The first and second substrate chucks 90 and 190 respectively moved to the second portion 21 may be spaced apart from each other. Further, the lower and upper substrates 300 and 400 may also be spaced apart from each other.

The second portion 21 of the bonding unit 24 may include an upper pin 155. The upper pin 155 may make vertically reciprocating movements. The upper pin 155 passes through the upper through holes 145 of the second substrate chuck 190 and applies pressure to the upper substrate 400 to bend the upper substrate 400.

In the upper substrate 400, portions in which the upper vacuum channels 135 of the second substrate chuck 190 are located may be in contact with the upper substrate 400 due to the suction force of the upper vacuum channels 135, and the upper substrate 400 may become bent from a portion in contact with the upper pin 155 while the upper pin 155 of the second substrate chuck 190 is gradually lowered. When the upper substrate 400 is in contact with the lower substrate 300, the upper pin 155 may stop being lowered.

Referring to FIG. 13, the suction force of the upper vacuum channels 135 of the second substrate chuck 190 may be removed. At a moment the suction force of the upper vacuum channels 135 is removed, the upper substrate 400 may be in contact with and bonded to the lower substrate 300 while edge portions in contact with the second substrate chuck 190 by the upper vacuum channels 135 are moved downward due to restoring force and gravity.

Since surfaces 320 and 420 facing each other of the lower substrate 300 and the upper substrate 400 are formed of an oxide material and moisture is present on the surfaces 320 and 420, the lower substrate 300 and the upper substrate 400 may be bonded to each other. The moisture in the facing surfaces 320 and 420 of the lower substrate 300 and the upper substrate 400 may be provided in the cleaning unit 15 of the first facility 100. For example, the lower substrate 300 and the upper substrate 400 are cleansed in the cleaning unit 15 and then may be moved to the bonding unit 24 with moisture on a surface thereof.

The bonded lower and upper substrates 300 and 400 may be referred to as a bonding substrate 500.

Next, the upper pin 155 (illustrated in FIG. 12) may be moved upward. Next, the first substrate chuck 90 on which the bonding substrate 500 is placed may be moved to the first portion 18 of the bonding unit 24.

Referring to FIG. 14, the bonding substrate 500 may be moved to the second facility 200 from the first substrate chuck 90 (illustrated in FIG. 13). The bonding strength between the lower substrates 300 and 400 of the bonding substrate 500 may be increased by performing a heat treatment process 510 in the second facility 200.

The first substrate chuck 90 according to various embodiments of the inventive concept may include the plurality of support pins 55 disposed on the lower base 43. The plurality of support pins 55 of the first substrate chuck 90 may be in contact with the first substrate that can be located on the first substrate chuck 90, that is, the lower substrate 300. Therefore, the plurality of support pins 55 of the first substrate chuck 90 may be in contact with a lower surface of the lower substrate 300. Foreign materials that are generated when the bonding process is repeated may not be located on the substrate contact surfaces of support pins 55 and dam portion 46 of the first substrate chuck 90, and the foreign materials are highly likely to be located between the plurality of support pins 55. Since the foreign materials located between the plurality of support pins 55 do not affect the contact between the first substrate chuck 90 and the lower substrate 300, bonding process defects due to the foreign materials may be prevented.

Since the first substrate chuck 90 according to various embodiments of the inventive concept is formed of a rigid material, for example, SiC material, the deformation caused by the foreign materials and environment may be minimized.

In the substrate bonding system 1 using the first substrate chuck 90 according to various embodiments of the inventive concept, since the plurality of support pins 55 of the first substrate chuck 90 are in contact with the lower substrate 300, the contact area between the first substrate chuck 90 and the lower substrate 300 may be minimized. Therefore, while the contact area between the first substrate chuck 90 and the lower substrate 300 is decreased, since the force transmitted to the lower substrate 300 due to the vacuum of the first substrate chuck 90 is minimized, overlay defects may be prevented from being generated.

The substrate bonding system 1 according to various embodiments of the inventive concept may include the first substrate chuck 90 having non-flat substrate contact surfaces 55 and 46 and the second substrate chuck 190 having a flat substrate contact surface. During the bonding process, as the upper substrate 400 that can be disposed under the second substrate chuck 190 becomes bent, the upper substrate 400 may start to be bonded to the lower substrate 300 disposed on the first substrate chuck 90. Since the substrate contact surfaces defined by the support pins 55 and dam portion 46 of the first substrate chuck 90 are not flat, the lower substrate 300 may be placed on the first substrate chuck 90 in a bent state. Therefore, the bent upper substrate 400 may be bonded to the bent lower substrate 300. The inventors have found that overlay defects are decreased in the lower and upper substrates 300 and 400 bonded in this manner.

The first substrate chuck according to various embodiments of the inventive concept may include the plurality of support pins disposed on the lower base. The plurality of support pins of the first substrate chuck may be in contact with the lower substrate that can be located on the first substrate chuck. Foreign materials that are generated when the bonding process is repeated may not be located on the substrate contact surface of the first substrate chuck, and the foreign materials are highly likely to be located between the plurality of support pins. Since the foreign materials located between the plurality of support pins do not affect the contact between the first substrate chuck and the lower substrate, bonding process defects due to the foreign materials can be prevented.

Since the first substrate chuck according to various embodiments of the inventive concept is formed of a rigid material, for example, a SiC material, the deformation caused by the foreign materials and environment can be minimized.

In the substrate bonding system using the first substrate chuck according to various embodiments of the inventive concept, since the plurality of support pins of the first substrate chuck are in contact with the lower substrate, the contact area between the first substrate chuck and the lower substrate can be minimized Therefore, as the contact area between the first substrate chuck and the lower substrate is decreased and since the force transmitted to the lower substrate due to the vacuum of the first substrate chuck is minimized, overlay defects can be prevented from being generated.

The substrate bonding system according to various embodiments of the inventive concept may include a first substrate chuck having non-flat substrate contact surfaces, and a second substrate chuck having a flat substrate contact surface. During the bonding process, as the upper substrate that can be disposed under the second substrate chuck becomes bent, the upper substrate can start to be bonded to the lower substrate 300 disposed on the first substrate chuck 90. Since the substrate contact surface of the first substrate chuck is not flat, the lower substrate may be placed on the first substrate chuck in a bent state. Therefore, the bent upper substrate can be bonded to the bent lower substrate. The inventors have found that overlay defects are decreased in the lower and upper substrates bonded in this manner.

Although a few embodiments have been described with reference to the accompanying drawings, those skilled in the art will readily appreciate that many modifications are possible in embodiments without departing from the scope of the inventive concept and without changing essential features. Therefore, the above-described embodiments should be considered in a descriptive sense only and not for purposes of limitation.

What is claimed is:

1. A substrate chuck, comprising:
a base having a vacuum hole formed in an upper surface thereof;
a plurality of support pins disposed on the upper surface of the base; and
a dam portion disposed on the base that circumferentially surrounds the plurality of support pins,
lift holes formed through the base; and
lift guard rings disposed on the first region of the base, and configured to expose the lift holes and surround the lift holes,
wherein the plurality of support pins include a plurality of first support pins extending outwardly from a first region of the base and a plurality of second support pins extending outwardly from a second region of the base,
wherein the plurality of first support pins have respective upper surfaces at a first level,
wherein the dam portion has an upper surface at a second level lower than the first level,
wherein the plurality of second support pins have respective upper surfaces that are tapered downwardly in a radially outward direction, wherein a height of each of the plurality of second support pins decreases in the radially outward direction, and wherein the respective heights of each of the plurality of second support pins are lower than the first level and higher than the second level, and
wherein the lift guard rings have upper surfaces disposed at the first level.

2. The chuck of claim 1, wherein the second region circumferentially surrounds the first region and the dam portion circumferentially surrounds the second region.

3. The chuck of claim 2, wherein a width of the first region is greater than a distance between the dam portion and the first region.

4. The chuck of claim 1, further comprising a vacuum channel formed in the base.

5. The chuck of claim 1, wherein heights of the plurality of first support pins are greater than distances between adjacent ones of the plurality of first support pins.

6. A substrate bonding system, comprising:
a lower substrate chuck; and
an upper substrate chuck disposed above the lower substrate chuck,
wherein the lower substrate chuck has a non-flat lower substrate contact surface, and
the upper substrate chuck has a flat upper substrate contact surface,
wherein the lower substrate chuck comprises:
a lower base having a vacuum hole formed in an upper surface thereof, a plurality of support pins extending outwardly from the upper surface of the lower base including a plurality of first support pins extending outwardly from a first region of the lower base and a plurality of second support pins extending outwardly from a second region of the lower base, a lower vacuum channel formed in the lower base;

lower lift holes formed through the lower base; and lower lift guard rings extending outwardly from the lwoer base and configured to expose the lower lift holes, wherein upper surfaces of the plurality of first support pins are at a first level, wherein the plurality of second support pins have respective upper surfaces that are tapered downwardly in a radially outward direction, wherein a height of each of the plurality of second support pins decreases in the radially outward direction, and wherein the respective heights of each of the plurality of second support pins are lower than the first level, and wherein the lower lift guard rings have an upper surface at the first level.

7. A substrate chuck, comprising:

a base having a vacuum hole formed in an upper surface thereof;

a plurality of support pins disposed on the upper surface of the base;

lift holes formed through the base; and lift guard rings disposed on the first region of the base, and configured to expose the lift holes and surround the lift holes, wherein the plurality of support pins comprise a plurality of first support pins extending outwardly from a first region of the base, a plurality of second support pins extending outwardly from a second region of the base, and a plurality of third support pins located at a border between the first region and the second region, wherein the plurality of first support pins have respective upper surfaces at a level that is higher than a level of upper surfaces of the plurality of second support pins, wherein a height of each of the plurality of second support pins decreases in a radially outward direction, wherein the upper surfaces of the plurality of second support pins are tapered downwardly in the radially outward direction, wherein an upper surface of each of the plurality of third support pins includes a flat portion and an inclined portion, and wherein the flat portion is at the level of the upper surfaces of the plurality of first support pins and wherein the inclined portion is at a level that is higher than the level of the upper surfaces of the plurality of second support pins, and wherein the lift guard rings have upper surfaces at the same level of the first support pins upper surfaces.

8. The chuck of claim 7, wherein heights of the plurality of first support pins are greater than distances between adjacent ones of the plurality of first support pins.

9. The system of claim 6, wherein:

the upper substrate chuck comprises an upper base, an upper through hole formed through a center portion of the upper base, an upper vacuum channel formed in an edge portion of the upper base, and upper lift holes formed through the upper base and disposed between the upper through hole and the upper vacuum channel; and wherein the lower lift holes are disposed between the plurality of support pins.

* * * * *